(12) United States Patent
Takasu et al.

(10) Patent No.: US 6,741,489 B2
(45) Date of Patent: May 25, 2004

(54) DATA HOLDING DEVICE AND ELECTRONIC CIRCUIT HAVING DATA HOLDING DEVICE

(75) Inventors: Hidemi Takasu, Kyoto (JP); Tsuneo Fujikawa, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 15 days.

(21) Appl. No.: 10/291,490

(22) Filed: Nov. 12, 2002

(65) Prior Publication Data

US 2003/0095452 A1 May 22, 2003

(30) Foreign Application Priority Data

Nov. 19, 2001 (JP) ........................ 2001-353849

(51) Int. Cl.[7] .............................................. G11C 7/00
(52) U.S. Cl. ...................................... 365/145; 365/191
(58) Field of Search ................................. 365/145, 191

(56) References Cited

U.S. PATENT DOCUMENTS 5,218,566 A  * 6/1993 Papaliolios .................. 365/145
5,262,982 A  * 11/1993 Brassington et al. ........ 365/145
5,270,967 A  * 12/1993 Moazzami et al. .......... 365/145
6,240,013 B1   5/2001 Nishimura ............. 365/185.07
6,314,016 B1   11/2001 Takasu ........................ 365/145

FOREIGN PATENT DOCUMENTS

JP        2000-124776         4/2000

* cited by examiner

*Primary Examiner*—M. Tran
(74) *Attorney, Agent, or Firm*—Morgan, Lewis & Bockius LLP

(57) ABSTRACT

The present invention provides a practical device which can hold data even if the power is shut OFF, and more particularly to a data holding device which has a high detection margin at data restoration and has high reliability. The data holding device 1 comprises a data latch circuit 3 and a composite capacitor 5. The data holding device 1 can store the data in the ferroelectric capacitors 17 and 19 in a non-volatile way. A voltage the same as the power supply voltage VDD is applied across the composite capacitor 5 where the ferroelectric capacitors 17 and 19 are connected in a series, and data is restored by detecting the voltage which is generated at the connection node 5a at this time. As a result, the detection margin can be dramatically increased.

18 Claims, 12 Drawing Sheets

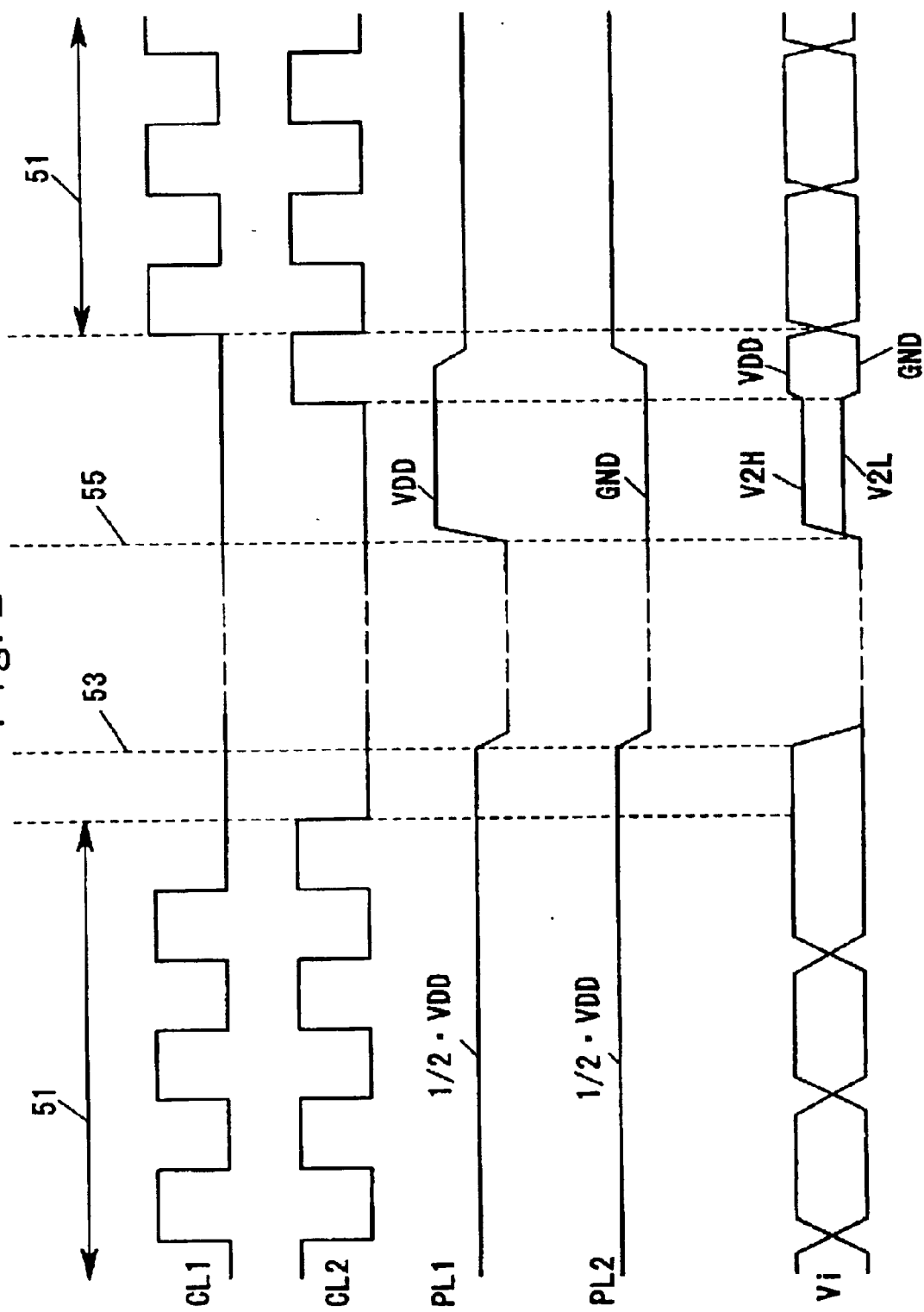

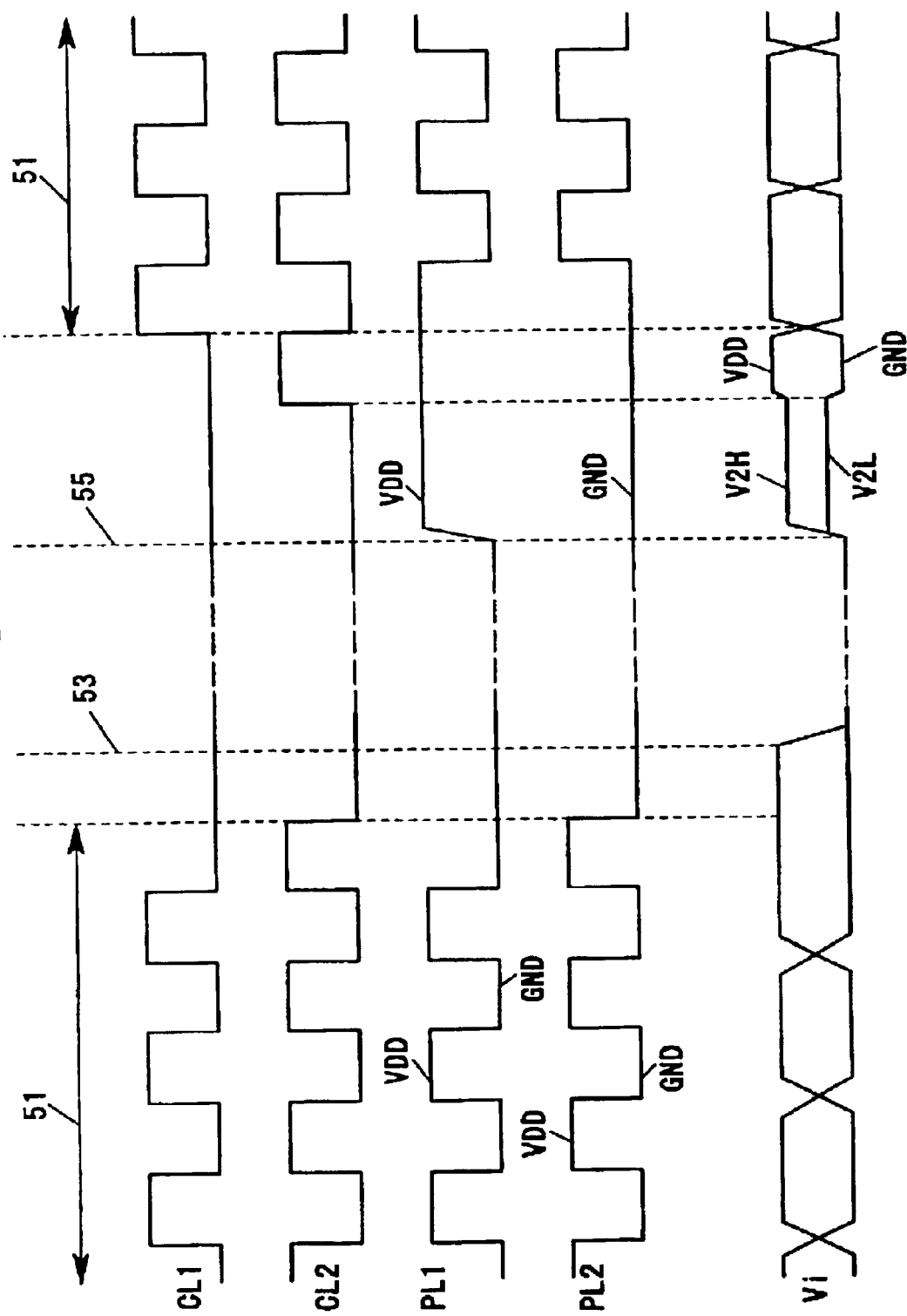

DATA HOLDING DEVICE AND ELECTRONIC CIRCUIT HAVING DATA HOLDING DEVICE

BACKGROUND OF THE INVENTION

1. Field of the Invention

The present invention relates to a data holding device, and more particularly to a data holding device having a data holding circuit for holding data in a volatile way.

2. Description of the Related Art

As a data holding circuit used for such a sequence circuit as a latch circuit, a circuit where two inverters are series-connected in a loop, for example, is known. Such a data holding circuit, however, normally can hold data only in a volatile way, so data is lost if power is shut OFF. In other words, the data before a power down cannot be restored even when power is turned back ON.

Therefore when sequence processing using such a sequence circuit is interrupted for any reason, for example, the power must be kept ON to hold the data, which wastes power. Also if sequence processing is interrupted for such a reason as an accidental power failure, the processing must be executed again from the beginning, which increases loss in processing time.

To solve such a problem, various circuits using a ferroelectric material, such as stated in U.S. Pat. No. 6,314,016, Japanese Patent Laid-Open No. 2000-124776, and U.S. Pat. No. 6,240,013 have been proposed.

U.S. Pat. No. 6,314,016 or U.S. Pat. No. 6,240,013 disclose a technology to use ferroelectric transistors, represented as an MFMIS (metal/ferroelectric/metal/insulator/semiconductor) type FET (Field Effect Transistor) as a non-volatile storage element. However, problems remain to turn a ferroelectric transistor into practical use, so a ferroelectric transistor has not yet been commercialized.

Japanese Patent Laid-Open No. 2000-124776 discloses a technology to use a ferroelectric capacitor, which is frequently seen in commercial use for a non-volatile memory device. However, in these publications, data is restored using parasitic capacity as the load capacity, along with the ferroelectric capacitor. For the parasitic capacity, where it is difficult to implement the capacity value as designed and errors in manufacturing steps are high, it is difficult to secure a detection margin to restore the data.

Even if a dedicated capacitor is installed as the load capacity, the load capacity does not store data in a non-volatile way, and dispersion occurs during manufacturing steps, so it is difficult to expect an increase of the detection margin for data restoration.

SUMMARY OF THE INVENTION

It is an object of the present invention to provide a practical device which solves the problems of such a conventional data holding circuit, and can hold data even if the power supply is shut OFF, and more particularly a data holding device which has high reliability with a large detection margin at data restoration.

A data holding device according to an embodiment of the present invention comprises a data holding circuit for holding data in a volatile way, a pair of signal lines to which signals can be applied independently from each other, and a composite capacitor comprising a pair of ferroelectric capacitors which are connected in a series, where a connection node is connected to a storage node of the data holding circuit and both ends thereof are connected to the pair of signal lines separately, wherein the polarization status corresponding to the data held in the data holding circuit is held by each one of the pair of ferroelectric capacitors by applying predetermined signals for writing to the pair of signal lines at least before the supply of power is stopped, and the data is restored in the data holding circuit based on the potential, which is generated in the connection node of the composite capacitor by applying a pair of signals for reading with different potentials to the pair of signal lines when the power supply restarts.

Since a pair of ferroelectric capacitors are used for restoring data, instead of a parasitic capacitor, it is easy to manufacture the data holding device as designed, and errors in the manufacturing steps are small. Therefore reliability in the data restoration when power returns is high.

A pair of polarization statuses corresponding to the data of the storage node of the data holding circuit are held in the pair of ferroelectric capacitors respectively. To read the data, a pair of signals for reading, having different potentials, are applied to both ends of the composite capacitor, and data is restored based on the voltage which is generated in the connection nodes of the composite capacitor depending on the pair of polarization statuses held in the pair of ferroelectric capacitors. Therefore the detection margin at data restoration can be increased compared with the case when data is held only in one ferroelectric capacitor.

In other words, a practical data holding device which can hold data even if power is shut OFF, and which has high reliability with a large detection margin at data restoration, can be implemented.

In this data holding device, it is possible that the saturation voltages of the pair of ferroelectric capacitors are substantially set to ½ or less of the amplitude voltage of the data in the data holding circuit respectively, the voltage within the range of the amplification voltage of the data in the data holding circuit is applied to each one of the pair of signal lines as the predetermined signals for writing, a potential substantially the same as the potential of the high level data in the data holding circuit is applied to one of the signal lines, and a potential substantially the same as the potential of the low level data in the data holding circuit is applied to the other signal line as a pair of signals for reading. Or, in this data holding device, it is also possible that the saturation voltage of the pair of ferroelectric capacitors is substantially the same or less than the amplitude voltage of the data in the data holding circuit respectively, a pulse signal, where the top potential is a potential substantially the same as the potential of the high level data in the data holding circuit and the bottom potential substantially the same as the potential of the low level data in the data holding circuit, is applied to each one of the pair of signal lines as the predetermined signals for writing, and a potential substantially the same as the potential of the high level data in the data holding circuit is applied to one of the signal lines, and a potential substantially the same as the potential of the low level data in the data holding circuit is applied to the other signal line as a pair of signals for reading.

Therefore in this data storage device, a pair of voltages corresponding to the data held in the data holding circuit, which is higher than the saturation voltage of the ferroelectric capacitor, can be applied to the pair of ferroelectric capacitors respectively by applying the signals for writing to the pair of signal lines. So a pair of remanent polarizations corresponding to the data can be generated at each one of the pair of ferroelectric capacitors without fail.

By applying signals for reading to the pair of signal lines, a voltage substantially the same as the amplitude voltage of the data in the data holding circuit can be applied to the composite capacitor. Therefore a voltage with a large margin corresponding to the data is generated at the connection point of the composite capacitor.

In the data holding device, it is possible that predetermined signals for writing are steadily applied to the pair of signal lines while power is supplied, or predetermined signals for writing are applied during only a predetermined period before the power supply is stopped. In the former case, it is not necessary for the signals lines to perform a special operation when power is shut OFF, so circuits can be simplified. In the latter case, polarization inversion of the ferroelectric capacitor rarely occurs during normal operation, so deterioration of the ferroelectric capacitors can be decreased even if quality of the ferroelectric capacitor is not good.

In this data holding device, it is possible that the data holding circuit includes a pair of inverter circuits which can be series-connected in a loop, and can connect the connection node of the composite capacitor to the input node of one inverter circuit of the pair of inverter circuits.

Therefore in the volatile data holding circuit which is generally used, the output of the inverter circuit to which the connection node of the composite capacitor is connected, can be returned to the status before power was shut OFF without fail.

Also in this data holding device, it is possible that the output node of the inverter circuit installed on a feedback path, out of the pair of inverter circuits, is connected to the input node of the inverter circuit installed on a main signal path via a gate for enabling/disabling feedback signals, the connection node of the composite capacitor is connected to the input node of the inverter circuit installed on the main signal path, and the pair of signals for reading are applied to the pair of signal lines while maintaining the gate for enabling/disabling feedback signals as disabled status when the power supply restarts, then the gate for enabling/disabling feedback signals is set to enable status.

When the power supply is restarted, the output of the inverter circuit installed on the feedback path is unstable, so such an output, being input to the input node of the inverter circuit installed on the main signal path, is blocked. Therefore only the potential, which was generated in the connection node of the composite capacitor of a pair of signals for reading, is applied to the input node of the inverter circuit installed on the main signal path at initialization when the power supply is restarted. In this way, the contention of signals, when the power supply is restarted, is prevented, so as to further improve the reliability of data restoration.

Also the contention of signals when the power supply is restarted is prevented using the gate for enabling/disabling feedback signals generally used for the latch circuit, so the contention of signals can be prevented without separately controlling the power supplies of the pair of inverter circuits when the power supply is restarted. Therefore the circuit configuration can be simplified.

In addition to the above embodiments, the present invention can be an electronic circuit comprising a gate for enabling/disabling signals, controlled based on the data held in the data holding device above described.

Therefore if the gate for enabling/disabling signals for connecting logical blocks in large scale logical circuits, such as DPGA (Dynamic Programmed Gate Array), is controlled based on the data held in the data holding device, then the enable/disable information is held without fail even when the power supply is shut OFF, so this invention is especially useful for decreasing power consumption.

BRIEF DESCRIPTION OF THE DRAWINGS

FIG. 2 is a timing chart depicting the operation of the data holding device shown in FIG. 1;

FIG. 10 is a timing chart depicting the operation of the data holding device according to still another embodiment of the present invention;

DESCRIPTION OF THE PREFERRED EMBODIMENTS

Figure 1:
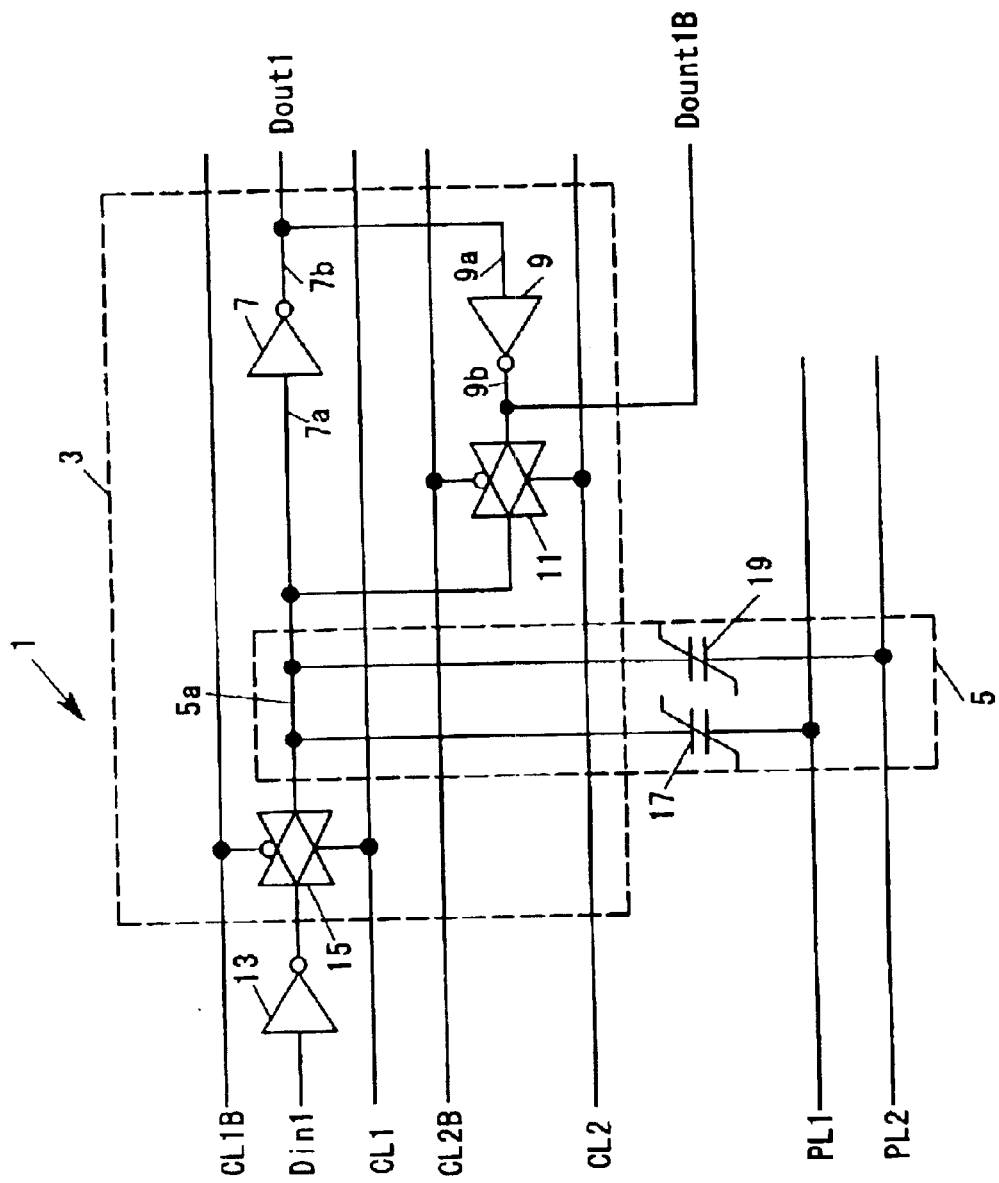
FIG. 1 is a circuit diagram depicting a data holding device according to an embodiment of the present invention.

FIG. 1 is a circuit diagram depicting the data holding device according to an embodiment of the present invention. The data holding device 1 comprises a data latch circuit 3, which is a data holding circuit, and a composite capacitor 5.

The data latch circuit 3 is comprised of a pair of inverter circuits 7 and 9 which can be series-connected in a loop. The output node 9b of the inverter circuit 9, which is installed on the feedback path, is connected to the input node 7a of the inverter circuit 7, which is installed on the main signal path, via the transfer gate 11, which is a gate for enabling/disabling feedback signals. The transfer gate 11 is controlled by the clock signal line CL2 and clock signal line CL2B, which is the inverted signal line of the clock signal line CL2. The output node 7b of the inverter circuit 7 is directly connected to the input node 9a of the inverter circuit 9.

The data assigned to the data input line Din1 is provided to the input node 7a of the inverter circuit 7 via the inverter circuit 13 and the transfer gate 15. The transfer gate 15 is controlled by the clock signal line CL1 and clock signal line CL1B, which is the inverted signal line of the clock signal line CL1.

The output node 7b and input node 7a of the inverter circuit 7 correspond to the storage nodes of the data latch circuit. The data output line Dout1 and data output line Dout1B, which is the inverted signal line of the data output line Dout1, are connected to the output node 7b and output node 9b respectively.

The composite capacitor 5 is comprised of a pair of ferroelectric capacitors 17 and 19 which are connected in series, the connection node 5a of the composite capacitor 5 is connected to the input node 7a of the inverter circuit 7, and both ends of the composite capacitor 5 are independently connected to the plate lines PL1 and PL2, which are a pair of signal lines for reading and writing. Signals can be applied to the plate lines PL1 and PL2 independently from each other.

At least before stopping the power supply to the data holding device 1, a predetermined signal for writing is applied to the plate line PL1 and PL2, so that a pair of polarization statuses which correspond to the data held in the data latch circuit 3, are held by a pair of ferroelectric capacitors 17 and 19 respectively.

Also by applying a pair of signals for reading, having predetermined different potentials, to the plate lines PL1 and PL2 when the power supply to the data holding device 1 is restarted, the data is restored in the data latch circuit 3 based on the potential Vi, which is generated in the connection node 5a of the composite capacitor 5.

The potential of the high level data (logic "H") of the data and the potential of the low level data (logic "L") in the data latch circuit 3 are the same as the power supply voltage VDD and the ground voltage GND respectively. Therefore the amplitude voltage of the data in the data latch circuit 3 is the same as the power supply voltage VDD.

Figure 3A:
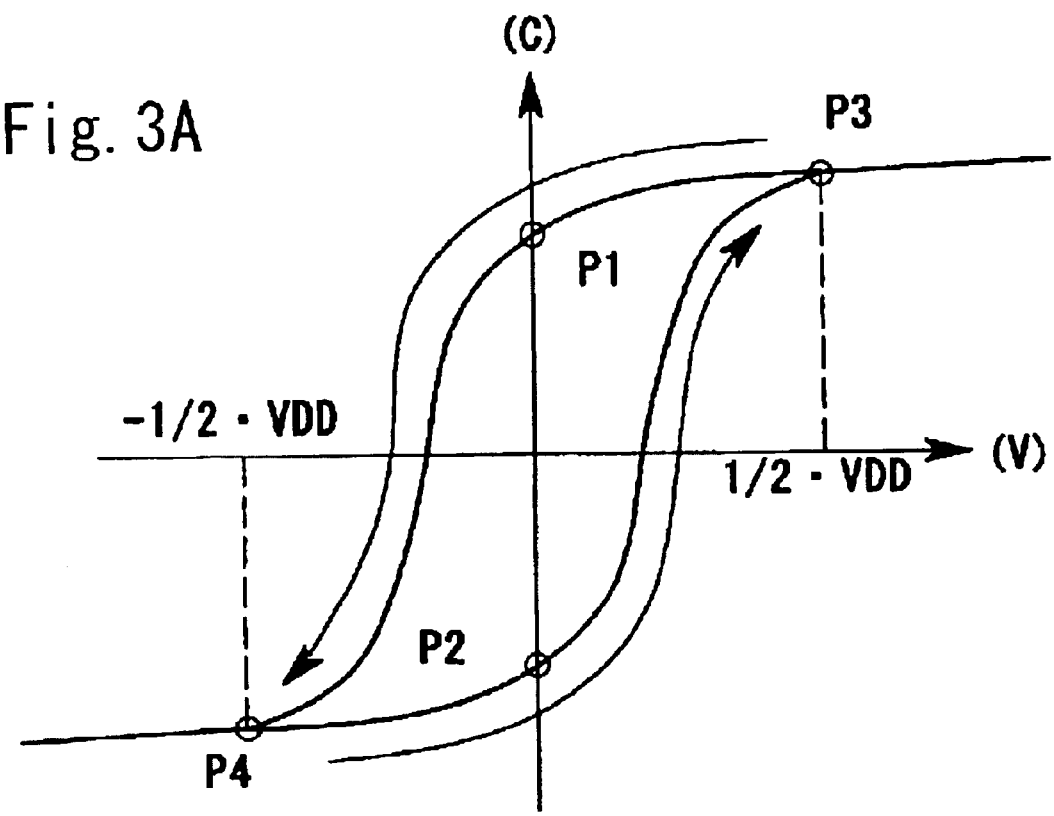
FIG. 3A and FIG. 3B are drawings depicting the polarization status of the ferroelectric capacitors 17 and 19 corresponding to the timing chart shown in FIG. 2.
Figure 3B:
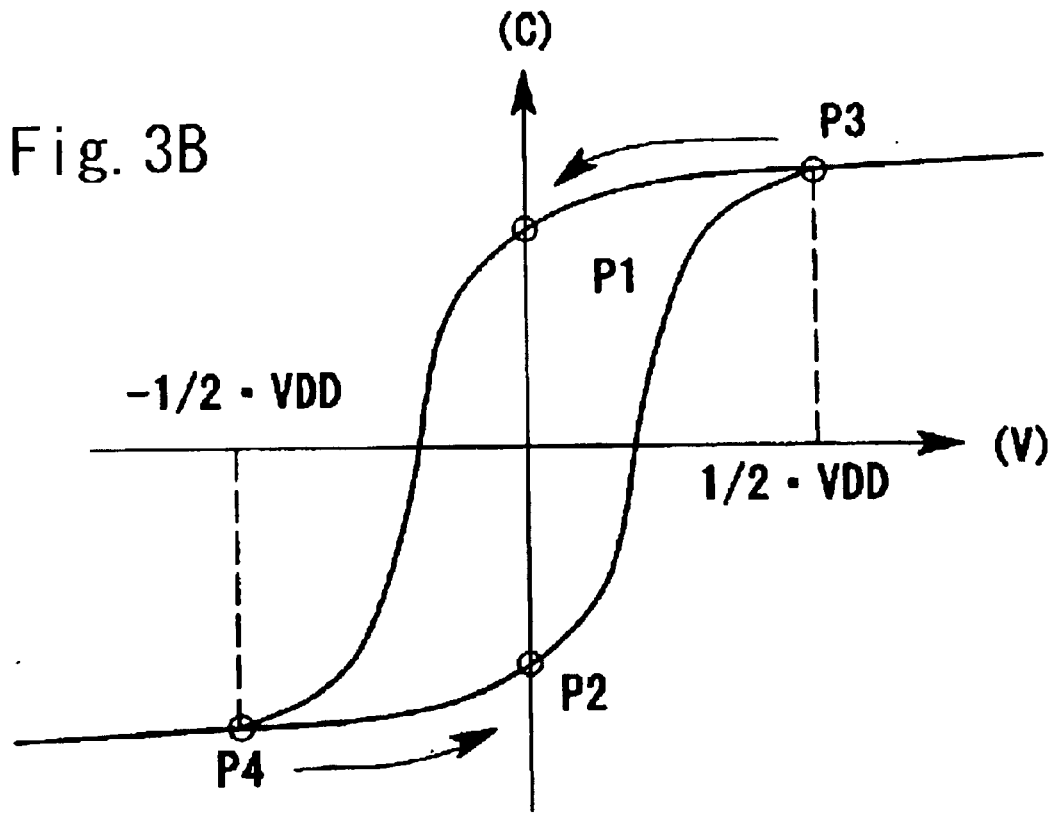
Figure 4:
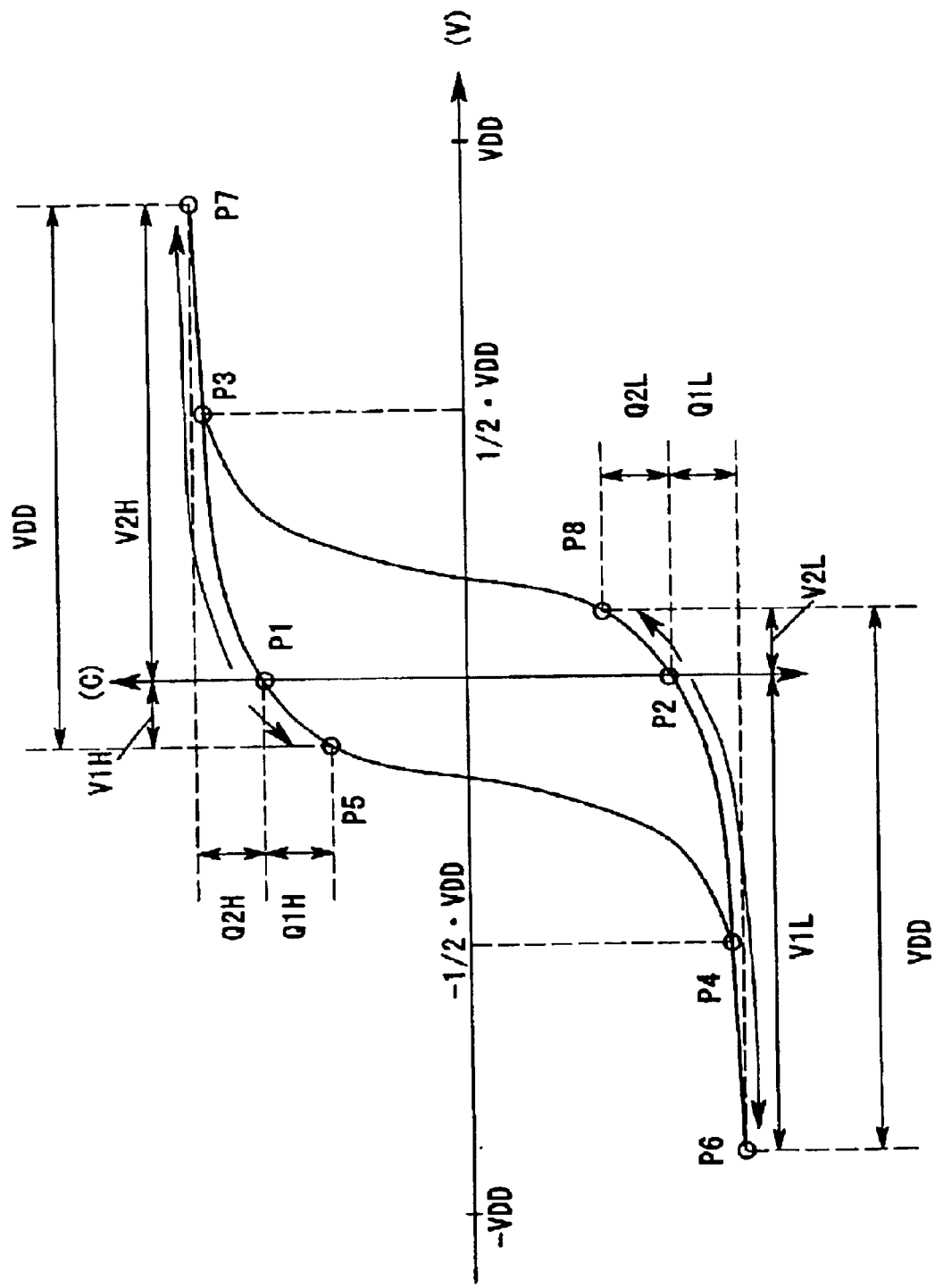
FIG. 4 is a drawing depicting the polarization status of the ferroelectric capacitors 17 and 19 corresponding to the timing chart shown in FIG. 2.

FIG. 2 is a timing chart depicting the operation of the data holding device 1 shown in FIG. 1. FIG. 3A to FIG. 3B and FIG. 4 are drawings depicting the polarization status of the ferroelectric capacitors 17 and 19 corresponding to the timing chart shown in FIG. 2. The operation of the data holding device 1 will now be described with reference to FIG. 1 to FIG. 4.

As FIG. 2 shows, in normal operation 51, a predetermined clock pulse is applied to the clock signal line CL1, and the clock pulse, where the clock pulse applied to the clock signal line CL1 is inverted, is applied to the clock signal line CL2. The voltage between the power supply voltage VDD and the ground voltage GND (e.g. about ½ the voltage of the power supply voltage VDD) is applied to both the plate lines PL1 and PL2.

As FIG. 1 shows, the data, which is input from the data input line Din1 is inverted by the inverter circuit 13, is latched at the fall of the clock pulse applied to the clock signal line CL1, and is held by the data latch circuit 3 during when this clock pulse is at low level.

FIG. 3A is a drawing depicting the relationship between the polarization status of the ferroelectric capacitors 17 and 19 (shown by electric charges equivalent to the polarization status in FIG. 3A) and the voltage in the normal operation 51. The ferroelectric capacitors 17 and 19 have the same characteristics since these capacitors are installed close to each other. The saturation voltage of the ferroelectric capacitors 17 and 19 are both substantially ½ the amplitude voltage of the data in the data latch circuit 3, that is, ½·VDD. In the case the saturation voltage of the ferroelectric capacitors 17 and 19 is a voltage smaller than ½ the amplitude voltage of the data, the application range of the voltage which can be applied to the plate lines PL1 and PL2 increases.

In FIG. 3A, the voltage of the ferroelectric capacitors 17 and 19 is the voltage of the connection node 5a when the plate lines PL1 and PL2 are used as reference, and the polarization direction when the voltage of the connection node 5a is higher than the plate lines PL1 and PL2 is regarded as positive.

Therefore in the normal operation 51, the polarization status of the ferroelectric capacitors 17 and 19 becomes P3 or P4, depending on whether the data value of the data output line Dout1B (that is the data at the input node 7a side of the inverter circuit 7) is "H" or "L".

If the power supply is shut OFF in this status (see 53 in FIG. 2), the polarization status of the ferroelectric capacitors 17 and 19 changes from P3 to P1 (or P4 to P2) as time elapses, as shown in FIG. 3B.

When the power is turned ON again as shown in FIG. 2 (see 55 in FIG. 2), the power supply voltage VDD and the ground potential GND are applied to the plate lines PL1 and PL2 respectively. By this, if the data of the data output line Dout1B is "H" just before power is shut OFF, for example, the polarization status of the ferroelectric capacitor 19 changes from P1 to P7, as shown in FIG. 4, and the polarization status of the ferroelectric capacitor 17 changes from P1 to P5.

When the potential difference between P1 and P5 is V1H, the potential difference between P1 and P7 is V2H, the difference of charges between P1 and P5 is Q1H, and the difference of charges between P1 and P7 is Q2H, then P5 and P7 satisfy V2H+V1H=VDD and Q2H−Q1H=0.

Therefore if the data of the data output line DOUT1B is "H" just before the power is shut OFF, the potential Vi of the connection node 5a of the composite capacitor 5 becomes V2H, shown in FIG. 4, when the power is turned ON again. If the data of the data output line Dout1B is "L" just before the power is shut OFF, on the other hand, the potential Vi of the connection node 5a of the composite capacitor 5 becomes V2L when the power is turned ON again.

Then if the clock signal line CL2 rises, as shown in FIG. 2, the potential Vi of the connection node 5a becomes logic "H" potential (VDD) or logical "L" potential (GND) depending on whether the potential is V2H or V2L. In this way, the data held in the data latch circuit 3 just before the power is shut OFF can be restored. Then the clock signal lines CL1 and CL2 and the plate lines PL1 and PL2 are returned to the status in normal operation 1.

In this way, the latch data is restored by a pair of ferroelectric capacitors having the same characteristics, so the detection margin can be dramatically increased.

Figure 5:
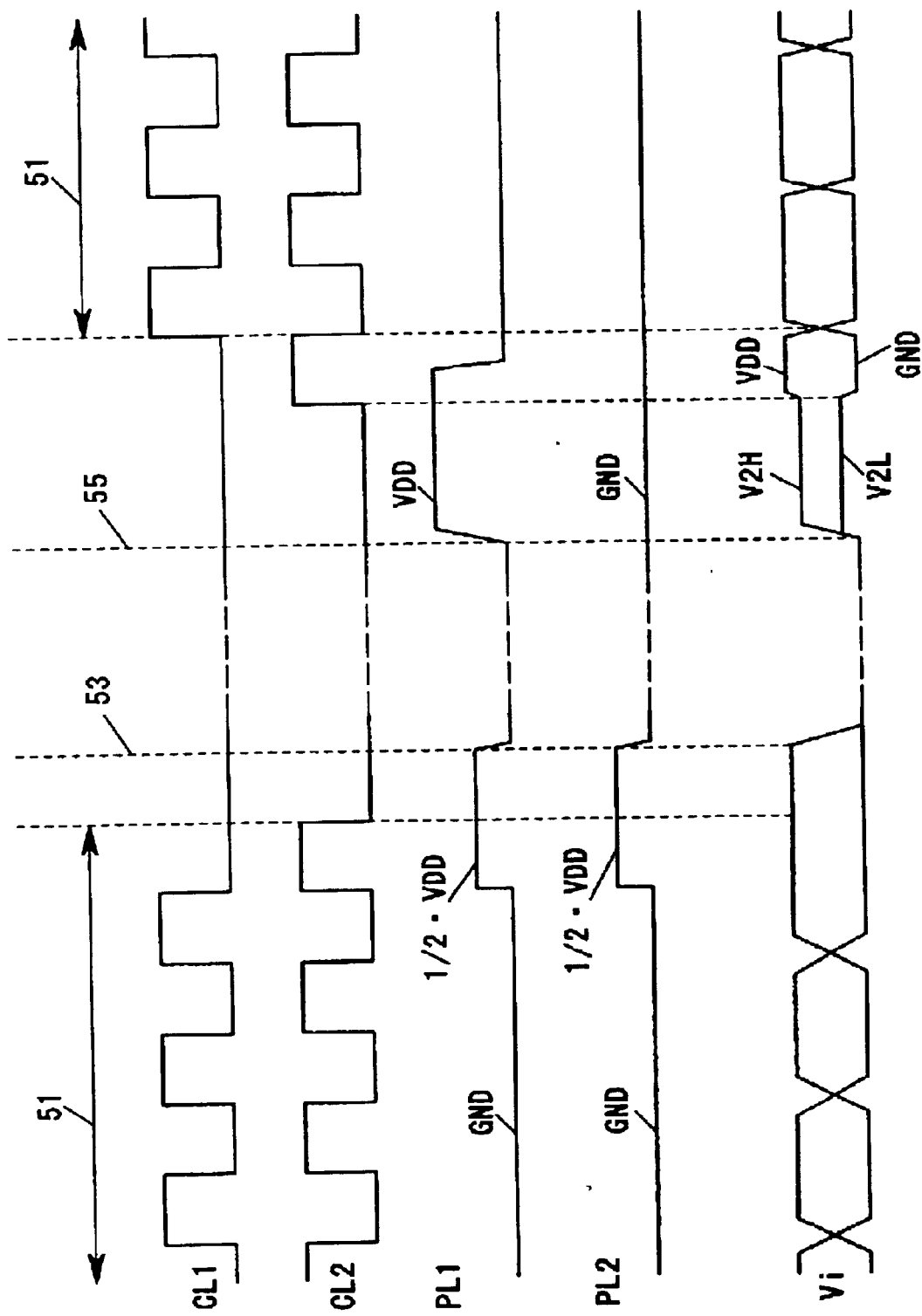
FIG. 5 is a timing chart depicting the operation of the data holding device according to another embodiment of the present invention.

FIG. 5 is a timing chart for depicting the operation of the data holding device according to another embodiment of the present invention. The circuit configuration of this data holding device is the same as the data holding device 1 shown in FIG. 1, so descriptions thereof are omitted.

The only difference between the data holding device according to the present embodiment and the data holding device 1 shown by the timing chart in FIG. 2 concerns the signal for writing which is applied to the plate lines PL1 and PL2.

In other words, in both FIG. 2 and FIG. 5, the signal for writing (about ½ the power supply voltage VDD) is applied to the plate lines PL1 and PL2 in the normal operation 51, but in the case of the embodiment shown in FIG. 2, the signal for writing is applied steadily, but in the embodiment shown in FIG. 5, the signal for writing is applied only during a predetermined period before the power supply stops. In other words, in the case of the embodiment in FIG. 5, the signal for writing is applied synchronizing with the data holding period (period when the clock pulse CL2 becomes logic "H") just before the power supply stops.

In this way, the polarization inversion of the ferroelectric capacitors 17 and 19 does not occur during the normal operation 51, so the deterioration of the ferroelectric capacitors 17 and 19 can be decreased. Since the capacity value of the ferroelectric capacitors 17 and 19 is small if polarization inversion does not occur, high-speed operation is possible.

Figure 6:
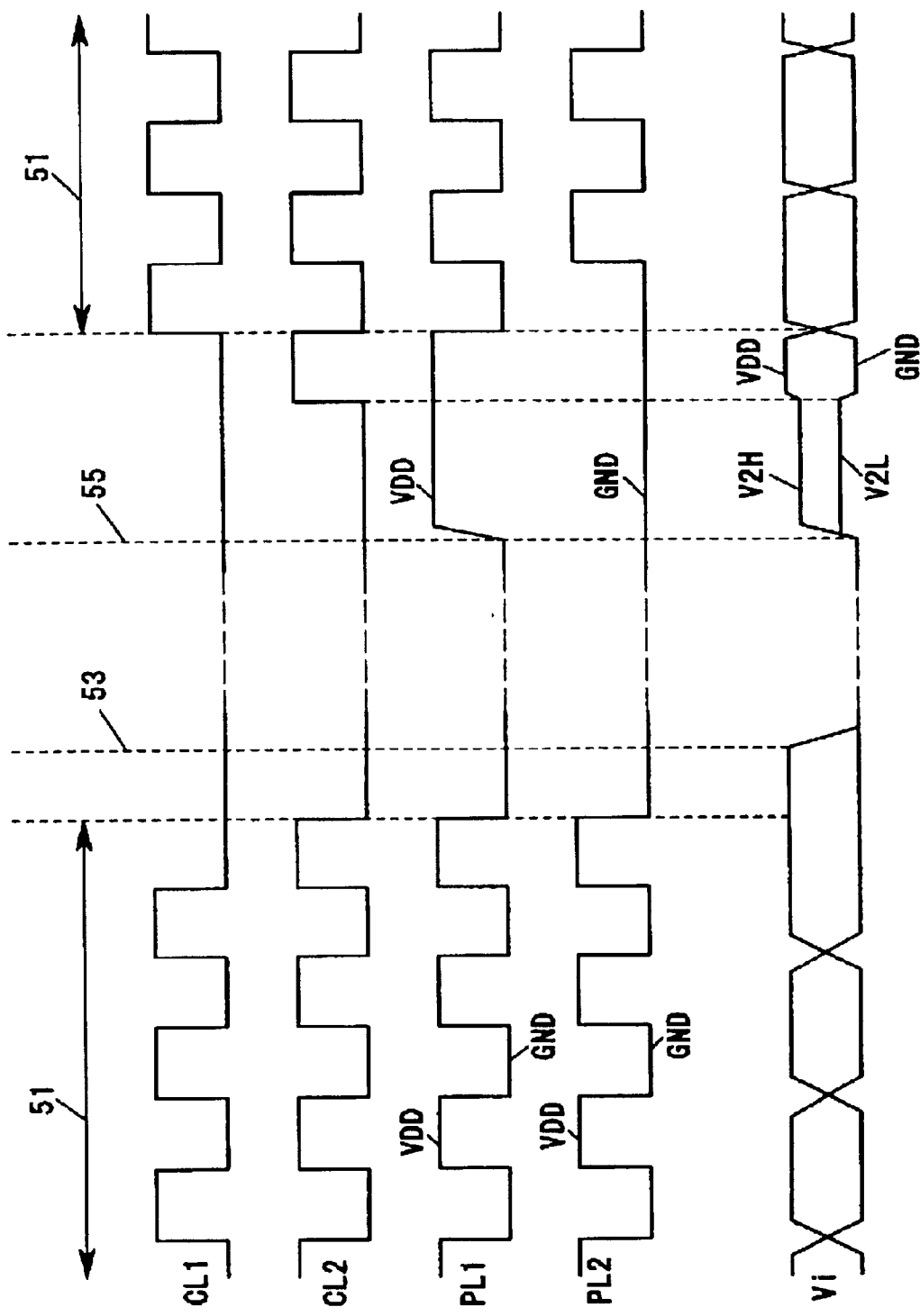
FIG. 6 is a timing chart depicting the operation of the data holding device according to still another embodiment of the present invention.

FIG. 6 is a timing chart depicting the operation of the data holding device according to still another embodiment of the present invention. The circuit configuration of this data holding device is also the same as the data holding device 1 shown in FIG. 1, so descriptions thereof are omitted. FIG. 7A to FIG. 7C and FIG. 8 are drawings depicting the polarization status of the ferroelectric capacitors 17 and 19 in the timing chart in FIG. 6.

The difference between the data holding device according to the present embodiment and the data holding device 1 shown in the timing chart in FIG. 2 is the saturation voltage of the ferroelectric capacitors 17 and 19 and the signals for writing to be applied to the plate lines PL1 and PL2.

In other words, according to the embodiment shown in FIG. 6, a pulse signal, where the power supply voltage VDD is the top potential and the ground potential GND is the bottom potential, is applied as the signal for writing. More particularly, a pulse signal synchronizing the data holding period (period when the clock pulse CL2 becomes logic "H") in the data latch circuit 3 is applied to the plate lines PL1 and PL2 as the signal for writing.

In this embodiment, the saturation voltage of the ferroelectric capacitors 17 and 19 are both substantially the same as the amplitude voltage VDD of the data latch circuit 3, as shown in FIG. 7A to FIG. 7C and FIG. 8. The saturation voltage of the ferroelectric capacitors 17 and 19 must be the same or smaller than the amplitude voltage VDD.

Figure 7A:
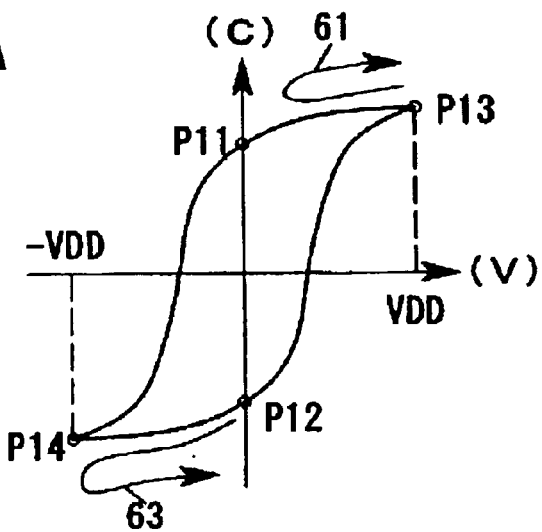
FIG. 7A to FIG. 7C are drawings depicting the polarization status of the ferroelectric capacitors 17 and 19 of the timing chart shown in FIG. 6.

Therefore in the normal operation 51, the polarization status of the ferroelectric capacitors 17 and 19 change along the path 61, shown in FIG. 7A, if the data at the input node 7a side of the inverter circuit 7 remains "H", and change along the path 63 if the data at the input node 7a side remains "L", but in both cases, the value of the remanence charge does not change.

Figure 7B:
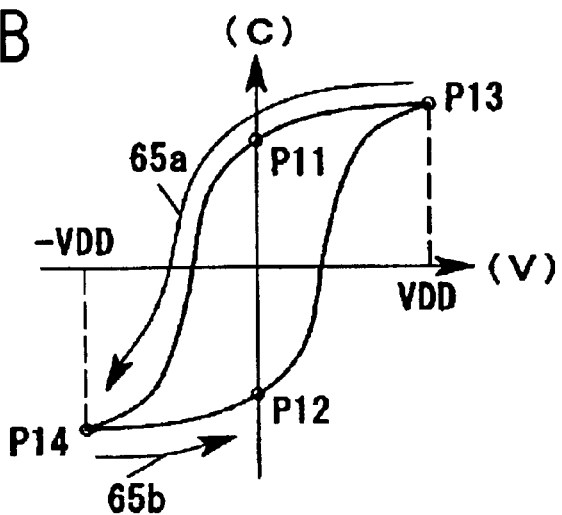

If the data at the input node 7a side of the inverter circuit 7 changes from "H" to "L", the polarization status changes along the paths 65a to 65b, shown in FIG. 7B. In other words, if the plate lines PL1 and PL2 are at ground potential and the data changes from "H" to "L", the status of P13 changes to P11, then becomes P14 the instant when the plate lines PL1 and PL2 become the power supply potential, and then becomes P12 when the plate lines PL1 and PL2 return to the ground potential.

Figure 7C:
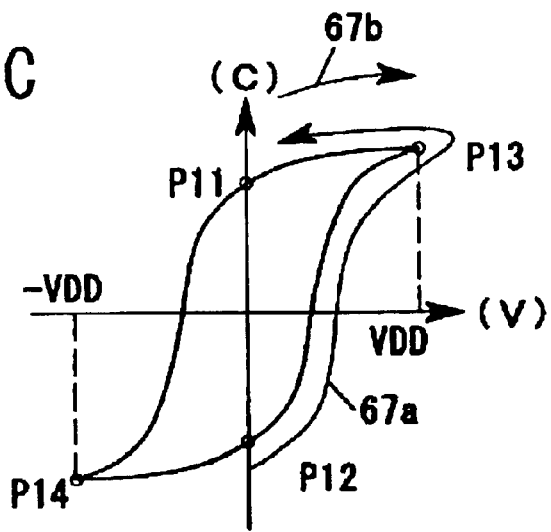

If the data at the input node 7a side changes from "L" to "H", the polarization status changes along the paths 67a to 67b, shown in FIG. 7C. In other words, if the plate lines PL1 and PL2 are at the ground potential and the data changes from "L" to "H", the status of P12 changes to P13, then becomes P11 the instant when the plate lines PL1 and PL2 become the power supply potential, then becomes P13 when the plate lines PL1 and PL2 returns to the ground potential.

When the power supply is shut OFF (see 53 in FIG. 6), the polarization status of the ferroelectric capacitors 17 and 19 moves to P11 or P12, shown in FIG. 7A, as time elapses.

Figure 8:
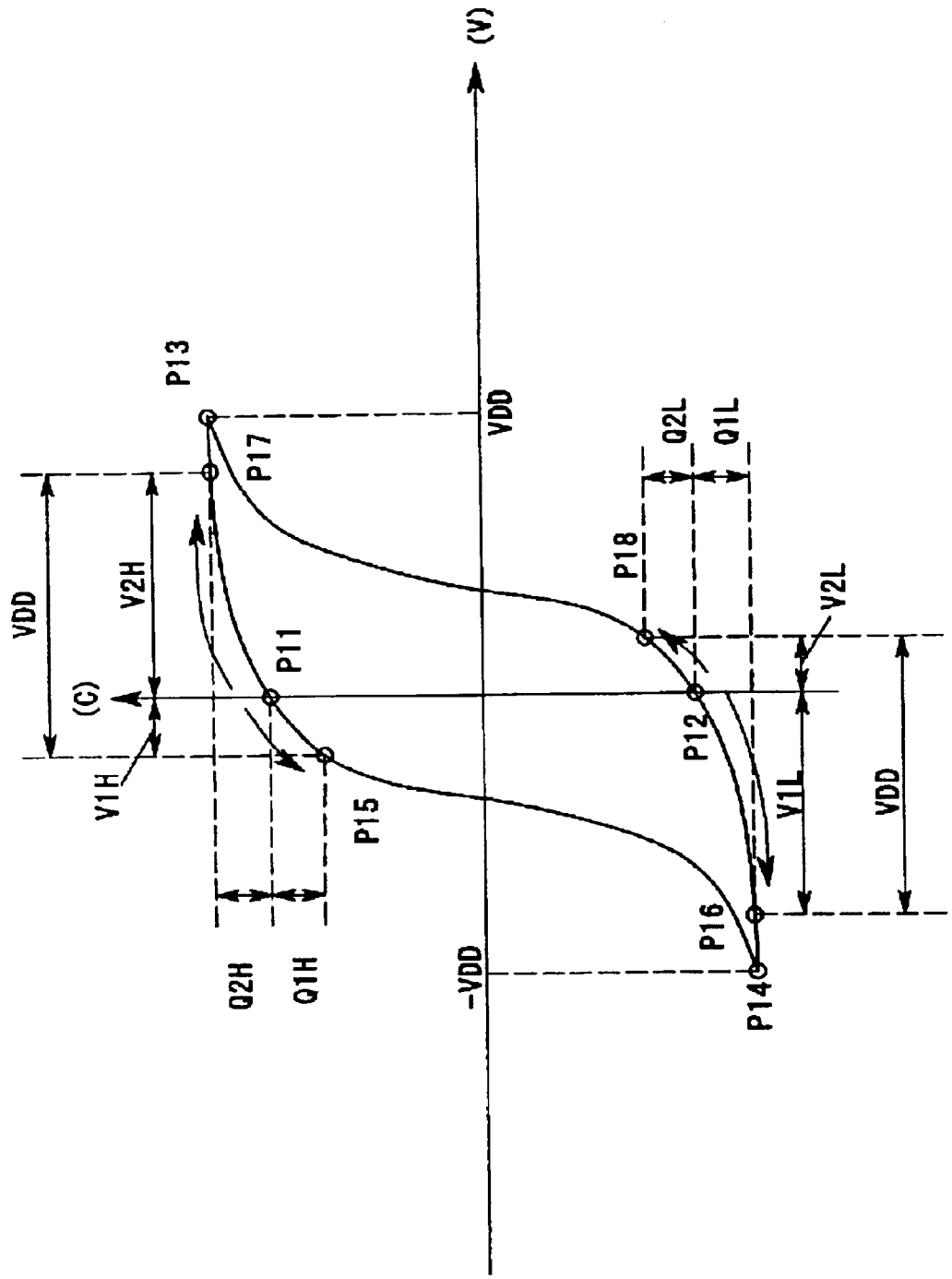
FIG. 8 is a drawing depicting the polarization status of the ferroelectric capacitors 17 and 19 of the timing chart shown in FIG. 6.

FIG. 8 is a drawing depicting the polarization status of the ferroelectric capacitors 17 and 19 when the power supply is turned ON again.

When the power supply is turned ON again, as shown in FIG. 6 (see 55 in FIG. 6), the power supply voltage VDD and the ground potential GND are supplied to the plate lines PL1 and PL2 respectively. By this, if the data of the data output line Dout1B is "H" just before power is shut OFF, for example, the polarization status of the ferroelectric capacitor 19 changes from P11 to P17, and the polarization status of the ferroelectric capacitor 17 changes from P11 to P15, as shown in FIG. 8.

Therefore, just like the case in FIG. 4, if the data of the data output line Dout1B just before the power supply is shut OFF is "H", the potential Vi of the connection node 5a of the composite capacitor 5 is V2H, as shown in FIG. 8. If the data of the data output line Dout1B just before the power supply is shut OFF is "L", on the other hand, the potential Vi of the connection node 5a of the composite capacitor 5 is V2L, as shown in FIG. 8. The operation hereafter is the same as the case of the embodiment shown in FIG. 2.

Figure 9:
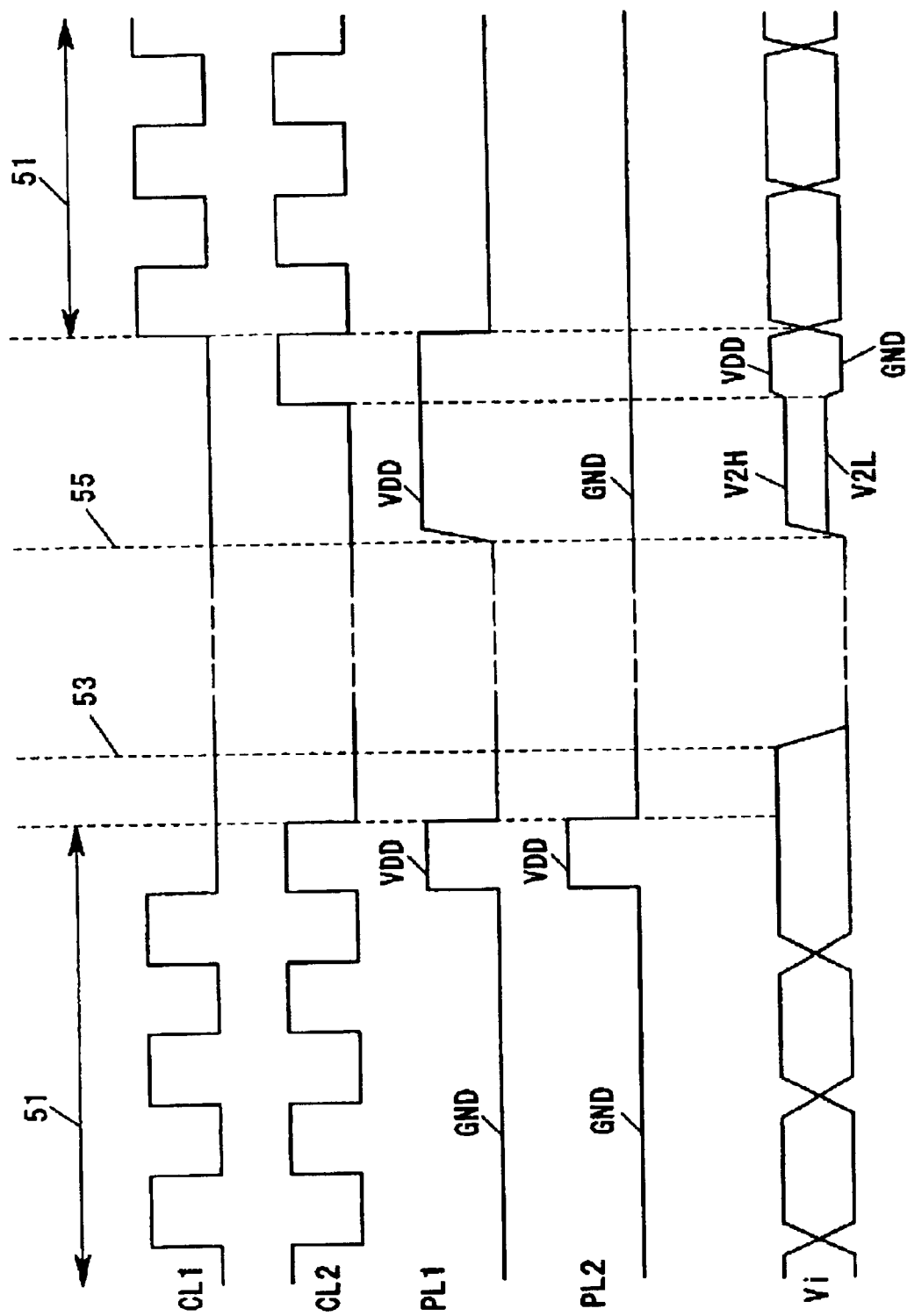
FIG. 9 is a timing chart depicting the operation of the data holding device according to still another embodiment of the present invention.

FIG. 9 is a timing chart depicting the operation of the data holding device according to still another embodiment of the present invention. The circuit configuration of this data holding device is the same as the data holding device 1 shown in FIG. 1, so description thereof is omitted.

The only difference between the data holding device according to this embodiment and the data holding device shown in the timing chart in FIG. 6 concerns the timing to apply the signal for writing to the plate lines PL1 and PL2.

In other words, in the case of the embodiment shown in FIG. 6, the signal for writing is applied steadily, but in the case of the embodiment shown in FIG. 9, the signal for writing is applied synchronizing the data holding period (period when the clock pulse CL2 becomes logic "H") just before the power supply is stopped, just like the case of the embodiment shown in FIG. 5.

In this way, the polarization inversion of the ferroelectric capacitors 17 and 19 does not occur during normal operation 51, just like the case of the embodiment in FIG. 5, so the deterioration of ferroelectric capacitors 17 and 19 can be decreased. Also high-speed operation is possible, just like the case of the embodiment in FIG. 5.

Figure 11A:
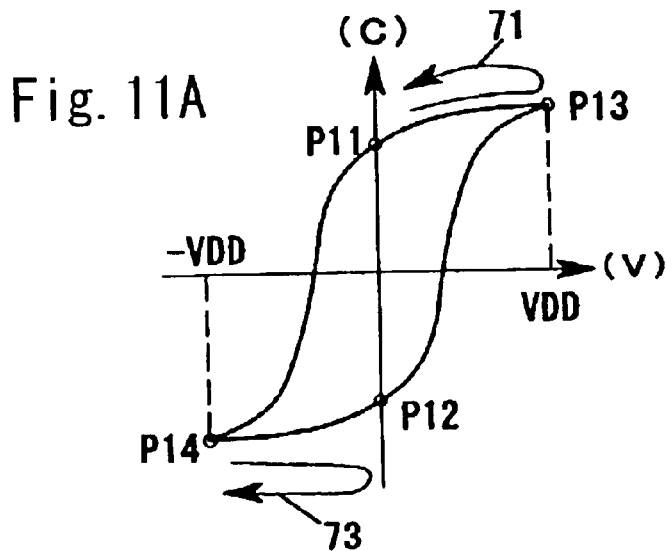
FIG. 11A to FIG. 11C are drawings depicting the polarization status of the ferroelectric capacitor 17 in the timing chart shown in FIG. 10.
Figure 11B:
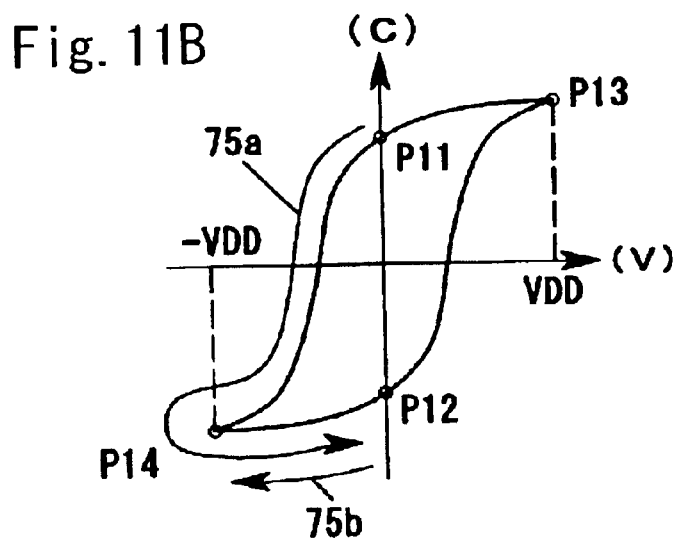
Figure 11C:
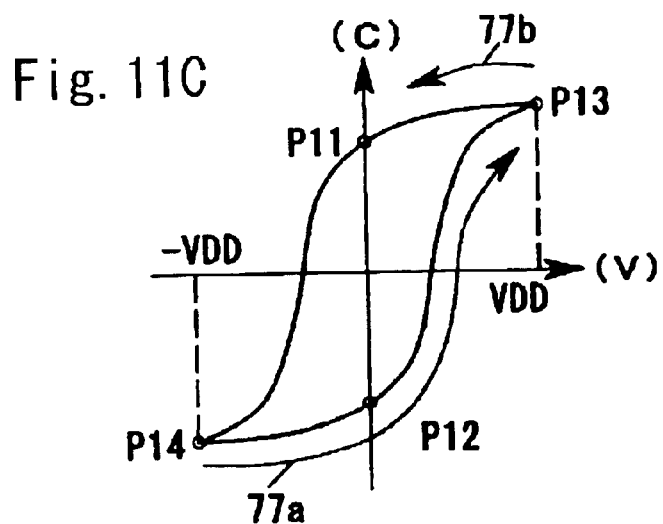

FIG. 10 is a timing chart depicting the operation of the data holding device according to still another embodiment of the present invention. The circuit configuration of this data holding device, as well, is the same as the data holding device 1 shown in FIG. 1, so description thereof is omitted. FIG. 11A to FIG. 11C are drawings depicting the polarization status of the ferroelectric capacitor 17 in the timing chart shown in FIG. 10.

The only difference between the data holding device according to the present embodiment and the data holding device shown in the timing chart in FIG. 6 concerns the signal for writing to be applied to the plate line PL1.

In other words, according to the embodiment shown in FIG. 10, a pulse signal, where the pulse signal to be applied to the plate line PL1 shown in FIG. 6 is inverted, is applied as the signal for writing.

In the normal operation 51, the polarization status of the ferroelectric capacitor 17 changes along the path 71, shown in FIG. 11A, if the data at the input node 7a side of the inverter circuit 7 remains "H", and changes along the path 73 if the data at the input node 7a side remains "L", but in both cases, the value of the remanence polarization does not change.

If the data at the input node 7a side of the inverter circuit 7 changes from "H" to "L", the polarization status changes along the paths 75a to 75b, shown in FIG. 11B. In other words, if the plate line PL1 is at the power supply potential and data changes from "H" to "L", the status of P11 changes to P14, then becomes P12 the instant when the plate line PL1 becomes ground potential, then becomes P14 when the plate line PL1 returns to the power supply potential.

If the data at the input node 7a side changes from "L" to "H", the polarization status changes along the paths 77a to 77b, shown in FIG. 11C. In other words, if the plate line PL1 is at the power supply potential and data changes from "L" to "H", the status of P14 changes to P12, then becomes P13 the instant when the plate line PL1 becomes the ground potential, and then becomes P11 when the plate line PL1 returns to the power supply potential.

The polarization status of the ferroelectric capacitor 19 in the embodiment in FIG. 10 is shown in FIG. 7A to FIG. 7C, just like the case of the embodiment shown in FIG. 6.

The operation hereafter is the same as the case of the embodiment shown in FIG. 6.

In the embodiment shown in FIG. 10, the signal for writing can be applied steadily, but just like the case of the embodiment shown in FIG. 5, the signal for writing may be applied synchronizing with the data holding period (period when the clock pulse CL2 becomes logic "H") just before the power supply stops.

In this case, the polarization inversion of the ferroelectric capacitors 17 and 19 during the normal operation 51 rarely occurs, just like the case of the embodiment shown in FIG. 5, so the deterioration of the ferroelectric capacitors 17 and 19 can be decreased, and the speed of the operation can be increased.

Figure 12:
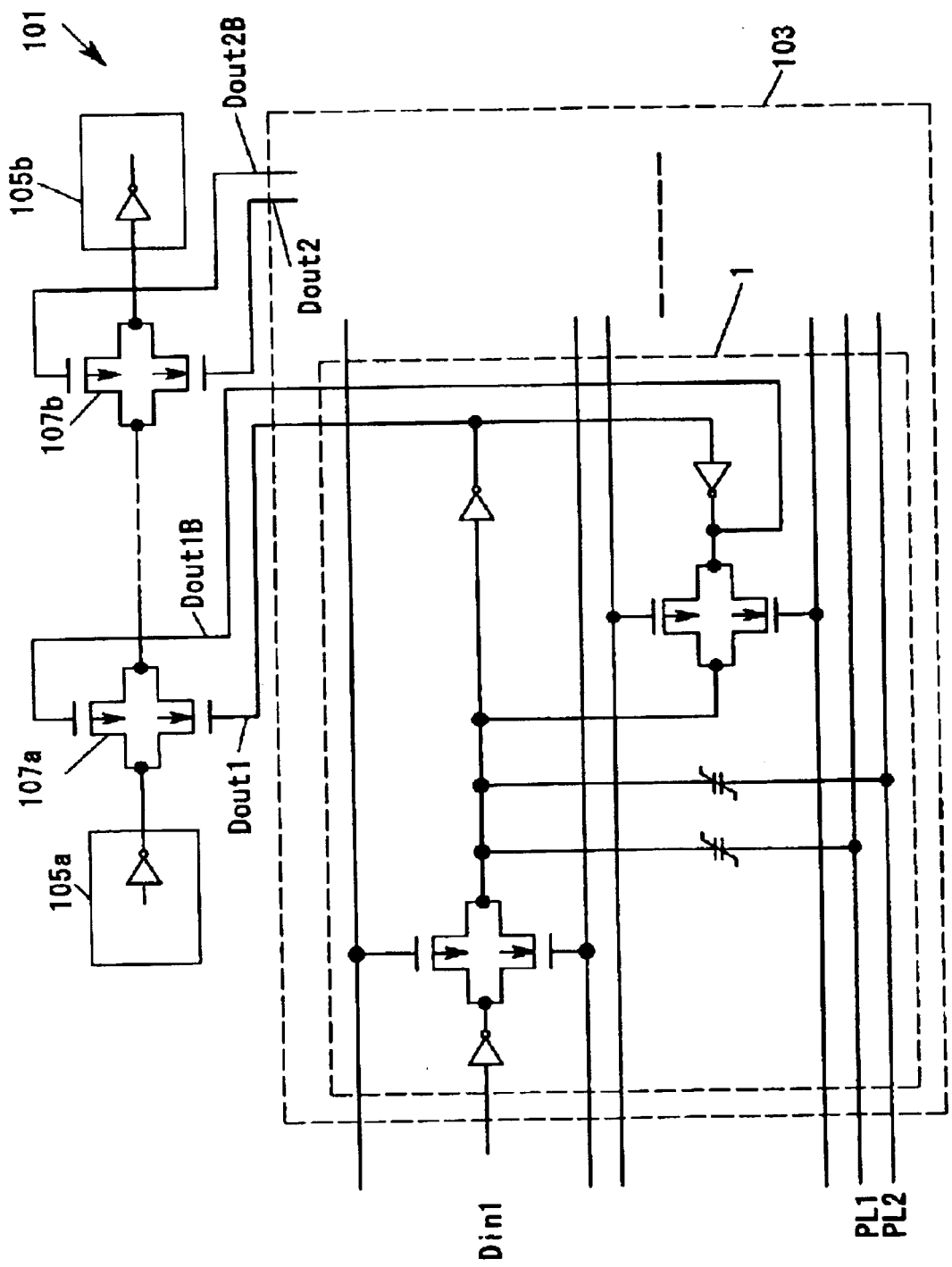
FIG. 12 is a drawing depicting the configuration of the electronic circuit according to still another embodiment of the present invention.

Now FIG. 12 shows the configuration of the electronic circuit 101 having the data holding device according to still another embodiment of the present invention. This electronic circuit 101 comprises a memory block 103, and logical blocks 105a, 105b ..., and transfer gates 107a, 107b ..., which are gates for enabling/disabling signals, and can be applied to, for example, DPGA (Dynamic Programmed Gate Array).

The logical blocks 105a, 105b, ... are comprised of a plurality of logical elements respectively. The logical blocks 105a, 105b, ... can be inter-connected via the transfer gates 107a, 107b, ...

The memory block 103 is comprised of a plurality of circuits of the data holding device 1, shown in FIG. 1 (data holding device corresponding to the timing chart in FIG. 2). For example, the data applied to the data input line Din1 is held by one data holding device 1 constituting the memory block 103, and is output via the data output lines Dout1 and Dout1B. The other data holding devices (not illustrated) are also configured in the same way.

Enable/disable of the transfer gates 107a, 107b, are controlled by a pair of data which is output from the data output lines Dout1 and Dout1B, and Dout2 and Dout2B, ... of the memory block 103.

By a configuration like this, the enable/disable information can be held without fail when the power supply is shut OFF, so DPGA and the like with extremely low power consumption can be implemented.

In the present embodiment, the memory block 103 is comprised of a plurality of circuits of the data holding device 1 corresponding to the timing chart in FIG. 2, but the present invention is not limited to this. The data holding device constituting the memory block 103 may be a data holding device corresponding to the timing chart in FIGS. 5, 6, 9 or 10.

In the present embodiment, the gate for enabling/disabling signals was described using a transfer gate consisted of PMOSFET and NMOSFET as an example, but the gate for enabling/disabling signals is not limited to this. For the gate for enabling/disabling signals, such a transistor as an FET, for example, may be used alone, or such a logical element as an AND element may be used.

In each one of the above described embodiments, the gate for enabling/disabling feedback signals was described using the transfer gate consisted of PMOSFET and NMOSFET as an example, but the gate for enabling/disabling feedback signals is not limited to this. For the gate for the enable/disable feedback signal, such a transistor as an FET, for example, may be used alone.

Also in each one of the above described embodiments, the output node of the inverter circuit installed on the feedback path is connected to the input node of the inverter circuit installed on the main signal path via the gate for enabling/disabling feedback signals, and the connection node of the composite capacitor is directly connected to the input node of the inverter circuit installed on the main signal path, but the present invention is not limited to this.

For example, it is also possible that the drive capability of the inverter circuit installed on the feedback path is set to be lower than the drive capability of the inverter circuit installed on the main signal path, the output node of the inverter circuit installed on the feedback path is directly connected to the input node of the inverter circuit installed on the main signal path, and the connection node of the composite capacitor is directly connected to the input node of the inverter circuit installed on the main signal path.

In each one of the above mentioned embodiments, the connection node of the composite capacitor is connected to the input node of the inverter circuit installed on the main signal path, but the present invention is not limited to this. The connection node of the composite capacitor may be connected to the input node of the inverter circuit installed on the feedback path.

It is also possible that another gate for enabling/disabling signals is installed between the connection node of the composite capacitor and the node of the main signal path, so that voltage is applied to the composite capacitor only at a predetermined timing.

In each of the above mentioned embodiments, the data holding circuit was described using the data latch circuit 3, which is a kind of sequence circuit, for example, but the present invention is not limited to this. The present invention can also be applied to another sequence circuit, such as a flip-flop circuit. Also the data holding circuit to which the present invention can be applied, other than the sequence circuit, can be a memory circuit, for example.

For the data holding circuit, the case where a pair of inverter circuits, which can be series-connected in a loop, was described as an example, but the data holding circuit is not limited to this. The present invention can be applied to all circuits which can hold data in a volatile way.

What is claimed is:

1. A data holding device, comprising:
   a data holding circuit for holding data in a volatile way;
   a pair of signal lines to which a signal can be applied independently from each other; and
   a composite capacitor constituted by a pair of ferroelectric capacitors connected in a series, where the connection node is connected to a storage node of the data holding circuit and both ends thereof are connected to the pair of signal lines separately,
   wherein the polarization status corresponding to the data held in the data holding circuit is held by the pair of ferroelectric capacitors respectively by applying predetermined signals for writing to the pair of signal lines at least before the power supply is stopped; and the data is restored in the data holding circuit based on the potential which is generated in the connection node of the composite capacitor by applying a pair of signals for reading with different potentials to the pair of signal lines when the power supply is restarted.

2. The data holding device according to claim 1, wherein the saturation voltage of said pair of ferroelectric capacitors are substantially set to ½ or less of the amplitude voltage of the data in said data holding circuit respectively;

the voltage within the range of the amplification voltage of the data in the data holding circuit is applied to each one of said pair of signal lines as said predetermined signal for writing; and a potential substantially the same as the potential of high level data in the data holding circuit is applied to one of the signal lines, and a potential substantially the same as the potential of low level data in the data holding circuit is applied to the other signal line as said pair of signals for reading.

3. The data storage device according to claim 1, wherein the saturation voltages of said pair of ferroelectric capacitors are set to be substantially the same as or less than the amplitude voltage of the data in said data holding circuit respectively;

a pulse signal, the top potential of which is a potential substantially the same as the potential of the high level data in the data holding circuit and the bottom potential of which is a potential substantially the same as the potential of the low level data in the data holding circuit, is applied to said pair of signal lines as said predetermined signal for writing; and a potential substantially the same as the potential of the high level data in the data holding circuit is applied to one of the signal lines, and a potential substantially the same as the potential of the low level data in the data holding circuit is applied to the other signal line as said pair of signals for reading.

4. The data holding device according to claim 1, wherein said predetermined signal for writing is applied to said pair of signal lines steadily while power is supplied.

5. The data holding device according to claim 2, wherein said predetermined signal for writing is applied to said pair of signal lines steadily while power is supplied.

6. The data holding device according to claim 3, wherein said predetermined signal for writing is applied to said pair of signal lines steadily while power is supplied.

7. The data holding device according to claim 1, wherein said predetermined signal for writing is applied during only a predetermined period before the power supply is stopped.

8. The data holding device according to claim 2, wherein said predetermined signal for writing is applied during only a predetermined period before the power supply is stopped.

9. The data holding device according to claim 3, wherein said predetermined signal for writing is applied during only a predetermined period before the power supply is stopped.

10. The data holding device according to claim 1, wherein said data holding circuit includes a pair of inverter circuits which can be series-connected in a loop; and the connection node of said composite capacitor is connected to the input node of one inverter circuit of the pair of inverter circuits.

11. The data holding device according to claim 2, wherein said data holding circuit includes a pair of inverter circuits which can be series-connected in a loop; and the connection node of said composite capacitor is connected to the input node of one inverter circuit of the pair of inverter circuits.

12. The data holding device according to claim 3, wherein said data holding circuit includes a pair of inverter circuits which can be series-connected in a loop; and the connection node of said composite capacitor is connected to the input node of one inverter circuit of the pair of inverter circuits.

13. The data holding device according to claim 10, wherein the output node of the inverter circuit installed on a feedback path out of said pair of inverter circuits is connected to the input node of the inverter circuit installed on a main signal path via a gate for enabling/disabling feedback signals;

the connection node of said composite capacitor is connected to the input node of the inverter circuit installed on the main signal path; and said pair of signals for reading are applied to said pair of signal lines while maintaining the gate for enabling/disabling feedback signals as disable status when the power supply is restarted, then the gate for enabling/disabling signals is set to enable status.

14. The data holding device according to claim 11, wherein the output node of the inverter circuit installed on a feedback path out of said pair of inverter circuits is connected to the input node of the inverter circuit installed on a main signal path via a gate for enabling/disabling feedback signals;

the connection node of said composite capacitor is connected to the input node of the inverter circuit installed on the main signal path; and said pair of signals for reading are applied to said pair of signal lines while maintaining the gate for enabling/disabling feedback signals as disable status when the power supply is restarted, then the gate for the enabling/disabling signals is set to enable status.

15. The data holding device according to claim 12, wherein the output node of the inverter circuit installed on a feedback path out of said pair of inverter circuits is connected to the input node of the inverter circuit installed on a main signal path via a gate for enabling/disabling feedback signals;

the connection node of said composite capacitor is connected to the input node of the inverter circuit installed on the main signal path; and said pair of signals for reading are applied to said pair of signal lines while maintaining the gate for enabling/disabling feedback signals as disable status when the power supply is restarted, then the gate for enabling/disabling signals is set to enable status.

16. An electronic circuit using the data holding device according to claim 1, comprising a gate for enabling/disabling signals which enables/disables signals, where enable/disable control is performed based on the data held in said data holding device.

17. An electronic circuit using the data holding device according to claim 2, comprising a gate for the enable/disable signal to enable/disable signals, where enable/disable control is performed based on the data held in said data holding device.

18. An electronic circuit using the data holding device according to claim 3, comprising a gate for enabling/disabling signals which enables/disables signals, where enable/disable control is performed based on the data held in said data holding device.

* * * * *